(12) United States Patent
Hageraats et al.

(10) Patent No.: US 11,038,465 B2
(45) Date of Patent: Jun. 15, 2021

(54) AMPLIFIER LINEARITY BOOST CIRCUITS AND METHODS FOR POST DISTORTION FEEDBACK CANCELATION

(71) Applicant: SKYWORKS SOLUTIONS, INC., Woburn, MA (US)

(72) Inventors: Johannes Jacobus Emile Maria Hageraats, Kamuela, HI (US); Junhyung Lee, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 49 days.

(21) Appl. No.: 16/502,200

(22) Filed: Jul. 3, 2019

(65) Prior Publication Data

US 2020/0014332 A1    Jan. 9, 2020

Related U.S. Application Data

(60) Provisional application No. 62/694,488, filed on Jul. 6, 2018.

(51) Int. Cl.
| | | |
|---|---|---|
| H03F 1/02 | (2006.01) | |
| H03F 1/32 | (2006.01) | |
| H03F 3/185 | (2006.01) | |
| H03F 3/193 | (2006.01) | |
| H03F 3/21 | (2006.01) | |
| H03G 3/30 | (2006.01) | |

(52) U.S. Cl.
CPC ............. *H03F 1/0205* (2013.01); *H03F 1/32* (2013.01); *H03F 3/185* (2013.01); *H03F 3/193* (2013.01); *H03F 3/21* (2013.01); *H03G 3/30* (2013.01)

(58) Field of Classification Search
USPC .................................. 330/149, 151, 277, 293
See application file for complete search history.

(56) References Cited

U.S. PATENT DOCUMENTS

| | | | | |
|---|---|---|---|---|
| 7,224,222 | B2 * | 5/2007 | Yum | H03F 1/02 330/149 |
| 7,656,229 | B2 * | 2/2010 | Deng | H03F 1/3205 330/149 |
| 9,054,653 | B2 * | 6/2015 | Gorbachov | H03F 1/34 |

* cited by examiner

*Primary Examiner* — Hieu P Nguyen
(74) *Attorney, Agent, or Firm* — Lando & Anastasi, LLP

(57) ABSTRACT

An amplifier circuit is provided that includes an amplifier having a signal input and a signal output, the amplifier being configured to produce an amplified signal at the signal output, a feedback path coupled between the signal output and the signal input, and an amplifier linearity boost circuit positioned in the feedback path. The amplifier linearity boost circuit includes a non-linear current generator and a phase-shifting circuit, the non-linear current generator being configured to provide a non-linear current based on the amplified signal, and the phase-shifting circuit being configured to adjust a phase of the non-linear current to reduce an intermodulation distortion of the amplified signal.

28 Claims, 9 Drawing Sheets

AMPLIFIER LINEARITY BOOST CIRCUITS AND METHODS FOR POST DISTORTION FEEDBACK CANCELATION

CROSS-REFERENCE TO RELATED APPLICATIONS

This application claims priority under 35 U.S.C. § 119(e) to U.S. Provisional Patent Application Ser. No. 62/694,488, titled "AMPLIFIER LINEARITY BOOST CIRCUITS AND METHODS FOR POST DISTORTION FEEDBACK CANCELLATION," filed Jul. 6, 2018, which is incorporated by reference herein in its entirety for all purposes.

BACKGROUND

Many wireless device designs, such as those for smartphones and tablets, require amplification of a signal without significant distortion. While amplifier architectures have been designed to reduce distortion, practically all wireless device designs will experience some measure of intermodulation distortion. Intermodulation distortion is the amplitude modulation of signals containing two or more different frequencies, and is quantified by the non-harmonic frequencies added to an input signal. Intermodulation distortion often occurs as a result of nonlinearities in an amplifier or pre-amplifier system. When uncontrolled, intermodulation distortion can increase bandwidth and create channel interference, among various other undesirable effects.

SUMMARY

Aspects and examples described herein relate to electronic systems, and in particular, to amplifier circuits for electronic systems and devices. Various examples of the amplifier circuits described herein are configured to reduce an intermodulation distortion in an amplified signal and improve system linearity over a wide range of temperatures and process variations.

According to an aspect of the present invention, an amplifier circuit is provided comprising an amplifier having a signal input and a signal output, the amplifier being configured to produce an amplified signal at the signal output, a feedback path coupled between the signal output and the signal input, and an amplifier linearity boost circuit positioned in the feedback path. The amplifier linearity boost circuit includes a non-linear current generator and a phase-shifting circuit, the non-linear current generator being configured to provide a non-linear current based on the amplified signal, and the phase-shifting circuit being configured to adjust a phase of the non-linear current to reduce an intermodulation distortion of the amplified signal.

In accordance with an embodiment, the non-linear current generator includes a transistor. In accordance with an aspect of this embodiment, the non-linear current generator includes a biasing circuit coupled to the transistor, the biasing circuit being configured to selectively bias the transistor. In accordance with a further aspect of this embodiment, the phase-shifting circuit includes a capacitor coupled in series with a resistor. In accordance with one example, the capacitor is a variable capacitor and the resistor is a variable resistor, and the capacitor and the resistor are coupled between the non-linear current generator and the signal input. In some embodiments, the transistor is a metal-oxide-semiconductor field-effect transistor (MOSFET), the transistor having a gate, a source, and a drain, the drain being coupled to the signal output and the source being coupled to the phase-shifting circuit. In some examples, the biasing circuit includes a first bias resistor coupled between the gate and an electrical ground, a second bias resistor coupled between the source and the electrical ground, and a bias switch coupled in parallel with a bias capacitor between the gate and the drain. In other examples, the amplifier circuit further comprises a bypass switch positioned in the feedback path and interposed between the signal output and the non-linear current generator, the bypass switch being configured to selectively decouple the amplifier linearity boost circuit from the signal output. In accordance with some embodiments, during a feedback mode of operation the bias switch is opened to decouple the gate from the electrical ground.

In other examples, the biasing circuit includes a first bias resistor coupled between the gate and a first bias input, a second bias resistor coupled between the source and a second bias input, and a bias capacitor coupled between the drain and the gate. In some examples, the amplifier circuit further comprises a bypass switch positioned in the feedback path and interposed between the signal output and the non-linear current generator, the bypass switch being configured to selectively decouple the amplifier linearity boost circuit from the signal output. In accordance with some embodiments, during a feedback mode of operation the biasing circuit is configured to bias the transistor based at least in part on a first control signal received at the first bias input and a second control signal received at the second bias input.

In still further examples, the biasing circuit includes a bias switch coupled between the gate and an electrical ground, and a current source coupled between the source and the electrical ground. In some examples, the amplifier circuit further comprises a bypass switch positioned in the feedback path and interposed between the signal output and the non-linear current generator, the bypass switch being configured to selectively decouple the amplifier linearity boost circuit from the signal output. In accordance with some embodiments, during a feedback mode of operation the bias switch is opened to decouple the gate from the electrical ground.

In accordance with other examples, the biasing circuit includes a current source coupled to the drain via a first bias switch, a bias resistor coupled between the source and an electrical ground, and a second bias switch coupled between the gate and the electrical ground. In some examples, the amplifier circuit further comprises a direct current blocking component positioned in the feedback path and interposed between the amplifier linearity boost circuit and the signal output. The amplifier circuit may further comprise a bypass switch positioned in feedback path and interposed between the signal output and the non-linear current generator, the bypass switch being configured to selectively decouple the amplifier linearity boost circuit from the signal output. In accordance with some embodiments, during a feedback mode of operation the first bias switch is closed to couple the current source to the drain, and the second bias switch is opened to decouple the gate from the electrical ground.

In accordance with some embodiments, the amplifier is configured to apply a variable gain to a signal received at the signal input to produce the amplified signal at the signal output. In some embodiments, the phase-shifting circuit is configured to shift the phase of the non-linear current based at least in part on a gain setting of the amplifier, and the phase-shifting circuit includes a variable capacitor coupled in series with a variable resistor. In at least one embodiment, at least one of the variable capacitor and the variable resistor are adjustable to vary the phase of the non-linear current. In accordance with some embodiments, the amplifier circuit further comprises a bypass switch positioned in the feedback path and interposed between the signal output and the non-linear current generator, the bypass switch being configured to selectively decouple the amplifier linearity boost circuit from the signal output based at least in part on a gain setting of the amplifier. In at least some embodiments, at least one of the variable capacitor and the variable resistor are adjustable to vary the magnitude of the non-linear current.

In accordance with an aspect of the present invention, the amplifier circuit may be included in a module, and the module may be included in an electronic device. In accordance with an aspect of the present invention, the amplifier circuit may be included in a system that includes an antenna to transmit and/or receive a signal, a transceiver, and the amplifier circuit coupled between at least the antenna and the transceiver.

In accordance with another aspect of the present invention, an amplifier feedback method is provided. The method includes receiving a signal at a signal input of an amplifier, amplifying the signal to provide an amplified signal at a signal output of the amplifier, applying a non-linear current to the signal received at the signal input based on the amplified signal, and shifting a phase of the non-linear current to reduce an intermodulation distortion of the amplified signal. In accordance with one aspect, shifting the phase of the non-linear current includes adjusting a complex impedance of a phase-shifting circuit, and adjusting the complex impedance of the phase-shifting circuit includes adjusting a value of at least one of a capacitor and a resistor. In accordance with another aspect, applying a non-linear current to the signal received at the signal input includes coupling a transistor in a feedback path between the signal input and the signal output, and applying the non-linear current with the transistor. In accordance with a still further aspect, the method may further includes adjusting a magnitude of the non-linear current to reduce the intermodulation distortion of the amplified signal, and adjusting the magnitude of the non-linear current includes adjusting a complex impedance of a phase-shifting circuit. In some embodiments, adjusting the magnitude of the non-linear current includes adjusting the magnitude of the non-linear current based on a gain setting of the amplifier, and in some embodiments, shifting the phase of the non-linear current includes shifting the phase based on a gain setting of the amplifier.

In accordance with yet a further aspect of the present invention, an amplifier feedback method may include amplifying a signal to provide an amplified signal at a signal output of an amplifier, producing a non-linear current based on the amplified signal, adjusting a complex impedance of a phase-shifting circuit to adjust at least one of a magnitude and a phase of the non-linear current, and applying the non-linear current to the signal at a signal input of the amplifier to reduce an intermodulation distortion of the amplified signal.

Still other aspects, examples, and advantages of these exemplary aspects and implementations are discussed in detail below. Examples disclosed herein may be combined with other examples in any manner consistent with at least one of the principles disclosed herein, and references to "an example," "some example," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, each identical or nearly identical component that is illustrated in various figures is represented by a like numeral. For purposes of clarity, not every component may be labeled in every figure. In the figures.

DETAILED DESCRIPTION

Figure 1:
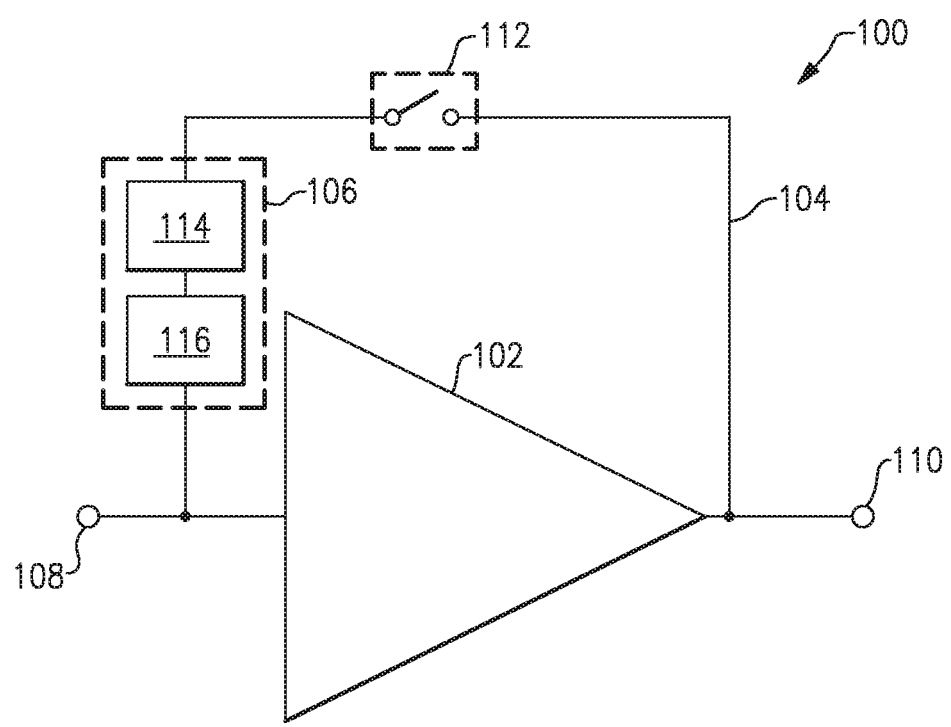
FIG. 1 is a block diagram of an amplifier circuit, according to various examples described herein.

Aspects and examples described herein relate to electronic systems, and in particular, to amplifier circuits for electronic systems and devices. In various examples, the described amplifier circuits include an amplifier linearity boost circuit coupled along a feedback path between a signal input and a signal output of an amplifier. The amplifier may include a low-noise amplifier, a power amplifier, or any other radio-frequency amplifier that may be found in an electronic device. Based on an amplified signal at the signal output of the amplifier, the amplifier linearity boost circuit is configured to apply a non-linear current to the signal input of the amplifier to reduce an intermodulation distortion of the amplified signal.

As discussed above, practically all wireless device designs will experience some measure of intermodulation distortion. To reduce intermodulation distortion, typically, an intermodulation distortion sink is coupled to an output of an amplifier system. The intermodulation distortion sink may include a transistor configured as a diode, a capacitor, and a resistor coupled in series between the output and an electrical ground. While offering improved performance for some operating conditions, an intermodulation distortion sink does not scale well over a wide temperature range or a wide range of process variations. In some instances (e.g., at certain temperatures, at certain amplifier gain settings, etc.), the intermodulation distortion sink may not offer any improvement in amplifier system linearity, and instead, may limit the performance of the amplifier system.

Various aspects and examples discussed herein reduce the intermodulation distortion of an amplified signal over a wide range of temperature variations and process variations. Moreover, various aspects and examples discussed herein may permit adaption to a fluctuating (e.g., changing) intermodulation distortion. This capability may be highly desirable in numerous applications. For example, in many wireless devices it is desirable that component devices exhibit minimal distortion over a wide variety of conditions. Aspects and examples of the amplifier circuits, devices, systems, modules, and processes discussed herein can meet these objectives for a range of such conditions, providing stable performance regardless of the temperature or process conditions. Accordingly, various aspects and examples disclosed herein may provide important functionality that is not available from conventional wireless devices.

It is to be appreciated that examples of the methods and apparatuses discussed herein are not limited in application to the details of construction and the arrangement of components set forth in the following description or illustrated in the accompanying drawings. The methods and apparatuses are capable of implementation in other examples and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

FIG. 1 is a block diagram of an amplifier circuit 100, according to various examples described herein. The amplifier circuit 100 is illustrated as including an amplifier 102, a feedback path 104, and an amplifier linearity boost circuit 106. The amplifier 102 includes a signal input 108 and a signal output 110. The feedback path 104 is connected at a first end to the signal input 108, and connected at a second end to the signal output 110. The amplifier linearity boost circuit 106 is positioned in the feedback path 104 between the signal input 108 and the signal output 110. As illustrated in FIG. 1, the amplifier circuit 100 may include a bypass switch 112 coupled along the feedback path 104 and interposed between the amplifier linearity boost circuit 106 and the signal output 110. Accordingly, the bypass switch 112 may be closed or opened to couple or decouple the amplifier linearity boost circuit 106 from the signal output 110. However, in certain other examples, the bypass switch 112 may be removed, and the signal output 110 may be directly coupled to the amplifier linearity boost circuit 106. In various examples, and as shown in FIG. 1, the amplifier linearity boost circuit 106 may include a non-linear current generator 114 and a phase-shifting circuit 116. Each of the non-linear current generator 114 and the phase-shifting circuit 116 are coupled along the feedback path 104 between the signal output 110 and the signal input 108.

The amplifier 102 is positioned to receive a signal at the signal input 108 and produce an amplified signal at the signal output 110. In many of the examples described herein, the signal is a radio-frequency signal. Accordingly, the amplifier 102 may be a low-noise amplifier, a power amplifier, or a radio-frequency amplifier, to name a few examples. In one particular example, the amplifier 102 is a radio-frequency amplifier coupled within a front-end receive path of a wireless device, such as a smart phone or tablet. In such an example, the amplifier 102 may receive the signal at the signal input 108 from an antenna, or one or more switching components coupled to an antenna, and may provide the amplified signal at the signal output 110 to a radio-frequency transceiver. However, other examples are not so limited, and in other implementations the amplifier 102 may be another type of amplifier, and in particular, may be an amplifier other than a radio-frequency amplifier (e.g., an audio amplifier).

While illustrated in FIG. 1 as having a single input, in various other examples the amplifier 102 may have a different type of input, or an arrangement of more than one input (e.g., a differential input). In some examples, the amplifier 102 provides a gain to the signal received at the signal input 108 to produce the amplified signal at the signal output 110. The amplifier 102 may have one or more gain stages, and in some examples, may provide a variable gain (e.g., adjustable gain) to the received signal. For instance, the amplifier 102 may have a low-gain stage configured to provide a first gain, a mid-gain stage configured to increase the gain relative to the low-gain stage, and a high-gain stage configured to increase the gain relative to the mid-gain stage. Each gain stage may correspond to a respective gain setting of the amplifier 102, e.g., a low-gain setting, a mid-gain setting, and a high-gain setting. It is appreciated that in various other examples the amplifier 102 may have any other number of gain stages, and accordingly, any number of gain settings. In certain examples, the amplifier 102 may also have an amplifier bypass setting during which the gain stages are disabled or bypassed and the amplifier 102 does not provide any gain.

In various examples, the amplified signal at the signal output 110 has an undesirable intermodulation distortion. The intermodulation distortion may be a result of a nonlinearity of the amplifier 102, for example. As such, the amplifier linearity boost circuit 106 is configured to reduce the intermodulation distortion of the amplified signal and improve the linearity of the amplifier 102. As further described below, various examples of the amplifier linearity boost circuit 106 offer a benefit of accommodating variations in the intermodulation distortion as a result of variations in temperature or process conditions (such as a changing gain setting). In particular, the non-linear current generator 114 is configured to produce a non-linear current based on the amplified signal at the signal output 110. As shown, the non-linear current generator 114 is coupled to the phase-shifting circuit 116, and configured to provide the non-linear current to the phase-shifting circuit 116. The phase-shifting circuit 116 is configured to adjust at least one of a phase and a magnitude of the non-linear current, and provide the non-linear current to the signal input of the amplifier 102. In various examples, the phase and/or magnitude of the non-linear current are controlled by the phase-shifting circuit 116 such that, when provided to the signal input 108, the non-linear current reduces (or completely cancels) the intermodulation distortion of the amplified signal. In particular, the phase and/or magnitude of the non-linear current may be adjusted such that the non-linear current destructively interferes with, and therefore reduces or cancels, the intermodulation distortion of the amplified signal at the signal output 110. The particular components of the non-linear current generator 114 and the phase-shifting circuit 116 are further described herein with reference to each of FIGS. 2-6, and with continuing reference to FIG. 1.

While described herein as generally providing a non-linear current, in various examples, the non-linear current generator 114 specifically produces a non-linear response, $S_y$, based on the amplified signal, $S_x$. For instance, the non-linear response, $S_y$, may be represented as:

$$S_y = a_0 + a_1 S_x + a_2 S_x^2 + a_3 S_x^3 + \ldots$$

In adjusting one or both of the phase and magnitude of the non-linear current, the phase-shifting circuit 116 is configured to adjust the phase and magnitude, respectively, of the polynomial terms (i.e., $a_0$, $a_1$, $a_2$, $a_3$, ..., $a_n$) of the non-linear response, $S_y$. Specifically, the phase-shifting circuit is configured to adjust the phase and magnitude of the polynomial terms such that the amplifier signal response is linearized.

Though the components of the drawings herein may be shown and described as discrete elements in a block diagram and may be referred to as "circuit" or "circuitry," unless otherwise indicated, the elements may be implemented as one of, or a combination of, analog circuitry, digital circuitry, or one or more microprocessors executing software instructions. Unless otherwise indicated, signal lines may be implemented as discrete analog or digital signal lines. Unless otherwise indicated, signals may be encoded in either digital or analog form; conventional digital-to-analog or analog-to-digital converters may not be shown in the drawings.

Figure 2:
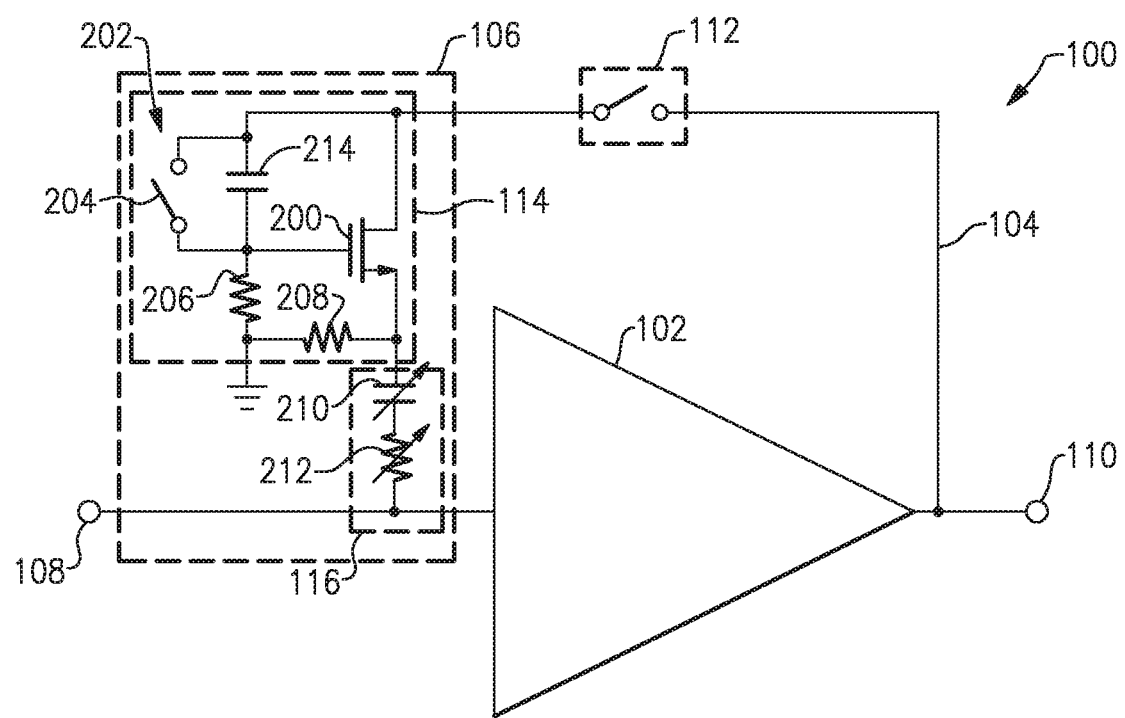
FIG. 2 is a schematic diagram of the amplifier circuit of FIG. 1, according to various examples described herein.

FIG. 2 is a schematic diagram of the amplifier circuit 100 of FIG. 1, according to various examples described herein. In particular, FIG. 2 illustrates an example implementation of the non-linear current generator 114 and the phase-shifting circuit 116. As illustrated, the non-linear current generator 114 may include a transistor 200 and biasing circuit 202. While the transistor 200 is illustrated as a three-terminal metal-oxide-semiconductor field-effect transistor (MOSFET) having a source, a drain, and a gate, in various other examples, the transistor 200 may be a different type of transistor or may be a MOSFET having more than three terminals. In the illustration of FIG. 2, the drain is selectively coupled to the signal output 110 via the bypass switch 112, and the source is coupled to the phase-shifting circuit 116.

The biasing circuit 202 may include various circuit elements configured to control a bias of the transistor 200, and therefore, a mode of operation of the amplifier linearity boost circuit 106. In various examples, the amplifier linearity boost circuit 106 may operate in a bypass mode of operation or a feedback mode of operation. During the bypass mode of operation, the bypass switch 112 may be opened to decouple or bypass the amplifier linearity boost circuit 106, and in particular the non-linear current generator 114, from the signal output 110. As such, during the bypass mode of operation, no non-linear current is produced or applied by the amplifier linearity boost circuit 106 to the signal input 108. As discussed, in some examples, the bypass switch 112 is optional, and may be removed from the feedback path 104. In these examples, one or more components of the non-linear current generator 114 may be controlled to decouple the amplifier linearity boost circuit 106 from the signal output 110.

During the feedback mode of operation, the bypass switch 112 is closed to couple the amplifier linearity boost circuit 106, and in particular the non-linear current generator 114, to the signal output 110. During the feedback mode of operation, the biasing circuit 202 is configured to bias the transistor 200, which applies the non-linear current to the signal input 108. While illustrated as a single-pole single-throw switch for the convenience of illustration, in various other examples, the bypass switch 112 may include any suitable device for controlling a flow of current between the signal output 110 and the amplifier linearity boost circuit 106.

In FIG. 2, the biasing circuit 202 is illustrated as including a bias switch 204, a first bias resistor 206, bias capacitor 214, and a second bias resistor 208. The drain of the transistor 200 is selectively coupled to the signal output 110 via the bypass switch 112, and also coupled to the gate of the transistor 200 via the bias capacitor 214. The first bias resistor 206 is coupled between the gate and an electrical ground. The bias switch 204 is selectively coupled in parallel with the bias capacitor 214 between the gate and the drain. The second bias resistor 208 is coupled between the source and the electrical ground.

During the bypass mode of operation, the bias switch 204 is opened to couple the gate to the electrical ground (e.g., through the first bias resistor 206). Accordingly, during the bypass mode of operation, the transistor 200 is biased to an OFF state, and no conductance occurs between the source and the drain. In the example in which the bypass switch 112 has been removed, the transistor 200 acts as a switch during the bypass mode to decouple the amplifier linearity boost circuit 106 from the signal output 110.

During the feedback mode of operation, the bias switch 204 is closed to short circuit the gate and the drain. Accordingly, during the feedback mode of operation the amplified signal at the signal output 110 is received at the drain of the transistor 200, the transistor is biased to an ON state, and conductance occurs between the source and drain to provide a non-linear current to the phase-shifting circuit 116. In various examples, a value (e.g., resistance) of the first bias resistor 206 and/or a value (e.g., resistance) of the second bias resistor 208 may be selected to control an operating point of the transistor 200. For example, the first bias resistor 206 may have a resistance value significantly larger (e.g., over 100 kΩ) than the second bias resistor 208 (e.g., 1 kΩ-10 kΩ). It is appreciated that the particular values of the bias resistors 206, 208 will depend on the supply voltage and current, and may be selected to set the bias point of the transistor 200 between about 100 μA and 700 μA. While the bias switch 204 is illustrated as a single-pole single-throw switch, in various other examples, the bias switch 204 may be implemented as any other suitable switch.

As further illustrated in the schematic illustration of FIG. 2, the phase-shifting circuit 116 may include a capacitor 210 coupled in series with a resistor 212 between the non-linear current generator 114 and the signal input 108. In particular, FIG. 2 shows the capacitor 210 coupled between the source of the transistor 200 and the resistor 212, and the resistor 212 coupled between the capacitor 210 and the signal input 108. In various examples, and as illustrated in FIG. 2, the capacitor 210 is a variable capacitor and the resistor 212 is a variable resistor. Accordingly, the phase-shifting circuit 116 may have a complex impedance that is adjustable via a value of the capacitor 210 and the resistor 212. The capacitor 210 and the resistor 212 function to adjust the phase and magnitude of the non-linear current. Accordingly, the values of the capacitor 210 and the resistor 212 may be increased or decreased to adjust the amount of phase or magnitude shift, and in particular, adjust the phase and magnitude of the polynomial terms of the non-linear response $S_y$.

During the feedback mode of operation, the phase-shifting circuit 116 receives the non-linear current from the non-linear current generator 114 and shifts the phase and/or magnitude of the non-linear current such that when the non-linear current is applied to the signal input 108 the intermodulation distortion of the amplified signal is reduced. In various examples, a value of the capacitor 210 and a value of the resistor 212 are selected to shift the phase of the non-linear current to 180 degrees out of phase (e.g., anti-phase) with the intermodulation distortion of the amplified signal. Accordingly, when applied to the signal input, the non-linear current and the intermodulation distortion destructively interfere thereby reducing (or completely eliminating) the intermodulation distortion. In certain examples, the phase-shifting circuit 116 may be coupled with additional circuit elements, such as a unity buffer and/or an inductor, to collectively provide the desired shift in phase or magnitude. Such additional circuit elements may also be positioned along the feedback path 104 and interposed between the non-linear current generator 114 and the signal input 108.

While in one example the phase-shifting circuit 116 may shift the phase of the non-linear current by 180 degrees relative to the intermodulation distortion, in various other examples, the phase of the non-linear current may be shifted by a different amount. For instance, the phase-shifting circuit 116 may shift the phase of the non-linear current by an arbitrary amount, which may vary over time, to achieve a 180 degree phase difference relative to the intermodulation distortion. That is, it is appreciated that in certain examples a phase shift of more or less than 180 degrees may be required to achieve a desired reduction in the intermodulation distortion. In particular examples, the value of the capacitor 210 and/or the resistor 212 may be adjusted during the operation of the amplifier 102 to accommodate for various temperature variations, various process variations, and/or other varying operating conditions that may affect the intermodulation distortion. Specifically, the value of the capacitor 210 and/or the resistor 212 may be adjusted based on the particular gain setting of the amplifier 102.

For instance, the low gain setting of the amplifier 102 may demand a more aggressive (e.g., larger magnitude and/or larger phase shift) non-linear current than the mid-gain setting of the amplifier 102 to achieve the same amount of relative intermodulation distortion reduction. Similarly, the mid-gain setting of the amplifier 102 may demand a more aggressive (e.g., larger magnitude and/or larger phase shift) non-linear current than the high-gain setting of the amplifier 102 to achieve the same amount of relative intermodulation distortion reduction. In certain examples, amplifier circuit 100 may be controlled to the bypass mode of operation during the high-gain setting of the amplifier. That is, the amplifier linearity boost circuit 106 may be decoupled from the signal output 110 and no non-linear current may be applied to the signal input during the high-gain setting.

Figure 3:
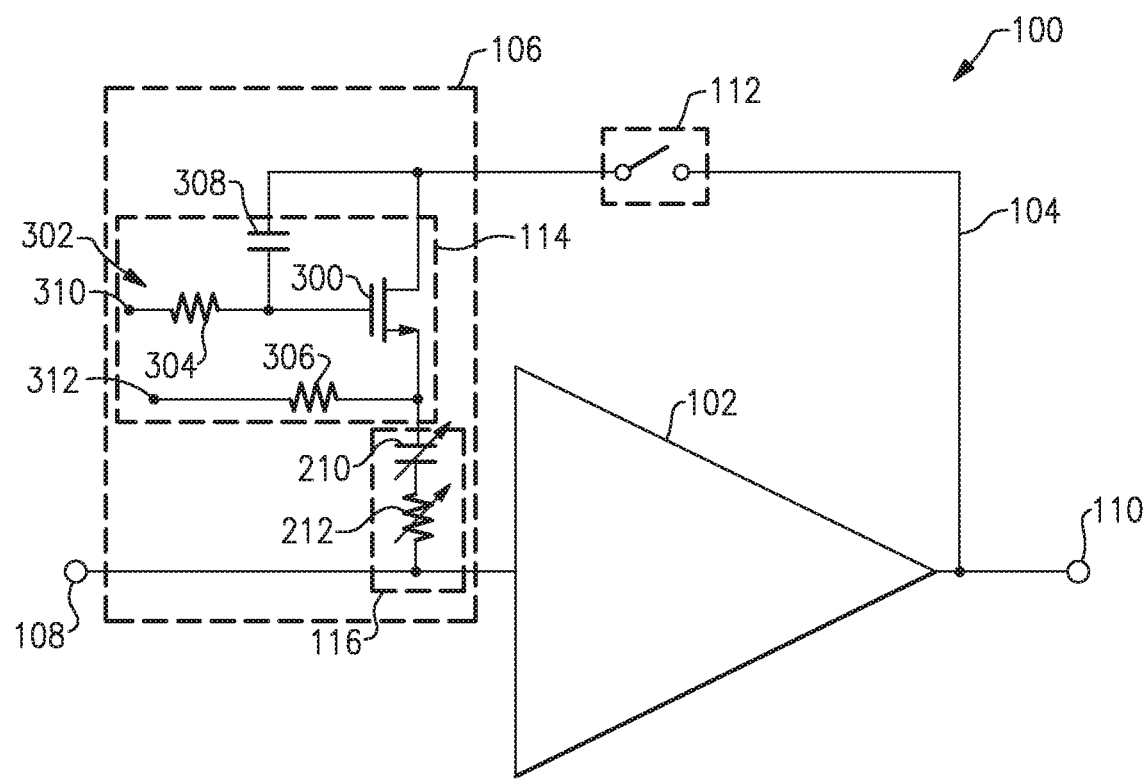
FIG. 3 is another schematic diagram of the amplifier circuit of FIG. 1, according to various examples described herein.

FIG. 3 is another schematic diagram of the amplifier circuit 100 of FIG. 1, according to various examples described herein. Similar to FIG. 2, FIG. 3 illustrates an example implementation of the non-linear current generator 114 and the phase-shifting circuit 116. As illustrated, the non-linear current generator 114 may include a transistor 300 and a biasing circuit 302. While the transistor 300 is illustrated as a three-terminal metal-oxide-semiconductor field-effect transistor (MOSFET) having a source, a drain, and a gate, in various other examples, the transistor 300 may be a different type of transistor or may be a MOSFET having more than three terminals. In the illustration of FIG. 3, the drain is selectively coupled to the signal output 110 via the bypass switch 112, and the source is coupled to the phase-shifting circuit 116.

The biasing circuit 302 may include various circuit elements configured to control a bias of the transistor 300, and therefore, the mode of operation of the amplifier linearity boost circuit 106. As previously discussed with reference to at least FIG. 2, the amplifier linearity boost circuit 106 may operate in one of a bypass mode of operation and a feedback mode of operation. During the bypass mode, the bypass switch 112 is open, and during the feedback mode the bypass switch 112 is closed. However, in some examples, the bypass switch 112 is optional, and may be removed from the feedback path 104. In these examples, one or more components of the non-linear current generator 114 may be controlled to decouple or couple the amplifier linearity boost circuit 106 from the signal output 110. For instance, in examples in which the bypass switch 112 has been removed, the transistor 300 acts as a switch during the bypass mode to decouple the amplifier linearity boost circuit 106 from the signal output.

In FIG. 3, the biasing circuit 302 is illustrated as including a first bias resistor 304, a second bias resistor 306, and a bias capacitor 308. The drain of the transistor 300 is selectively coupled to the signal output 110 via the bypass switch 112, and also coupled to the gate of the transistor 300 via the bias capacitor 308. The first bias resistor 304 is coupled between the gate and a first bias input 310, and the second bias resistor 306 is coupled between the source and a second bias input 312. The first bias input 310 is configured to receive a first control signal, and the second bias input 312 is configured to receive a second control signal.

During the feedback mode of operation, the biasing circuit 302 is configured to bias the transistor 300 based on the first control signal received at the first bias input 310, and the second control signal received at the second bias input 312. In contrast to the arrangement previously described with reference to FIG. 2, the first control signal and the second control signal may be provided to directly control and bias the transistor 300. For instance, the first bias input 310 may be coupled to a high direct current (DC) power source (e.g., a VDD power source), and the second bias input 312 may be coupled to a low DC power source (i.e., a lower-valued DC power source). In some examples, the second bias input 312 may instead be an electrical ground. Accordingly, when the first control signal is received at the first bias input 310, and the second control signal is received at the second bias input 312, the transistor 300 is biased to an ON state, and conductance occurs between the source and the drain to provide a non-linear current to the phase-shifting circuit 116.

During the bypass mode of operation, the transistor 300 is biased to an OFF state via the first control signal and the second control signal. As such no conductance occurs between the source and the drain. For instance, a voltage applied to the gate via the first bias input 310 may be reduced, relative to the feedback mode, to turn the transistor 300 OFF. In certain examples, the transistor 300 may also be reverse-biased to improve isolation and ensure that the amplifier 102 is not loaded when not enabled. For instance, a larger bias voltage may applied to the second bias input 312 relative to a bias voltage applied to the first bias input 310 to reverse bias the transistor 300. Such an example may minimize spurious intermodulation distortion (IMD) when the amplifier linearity boost circuit 106 is not enabled. In various examples, a value of the first bias resistor 304, a value of the second bias resistor 306, and/or a value of the bias capacitor 308 may be selected to control an operating point of the transistor 300.

In various examples, the implementation of the phase-shifting circuit 116 illustrated in FIG. 3 may include many of the same components as the implementation of the phase-shifting circuit 116 illustrated in FIG. 2. For instance, the phase-shifting circuit 116 may include the capacitor 210 coupled in series with the resistor 212 between the non-linear current generator 114 and the signal input 108. Accordingly, the capacitor 210, the resistor 212, and more generally, the phase-shifting circuit 116, as shown in FIG. 3, may operate in a manner similar to that previously described with reference to FIG. 2.

Figure 4:
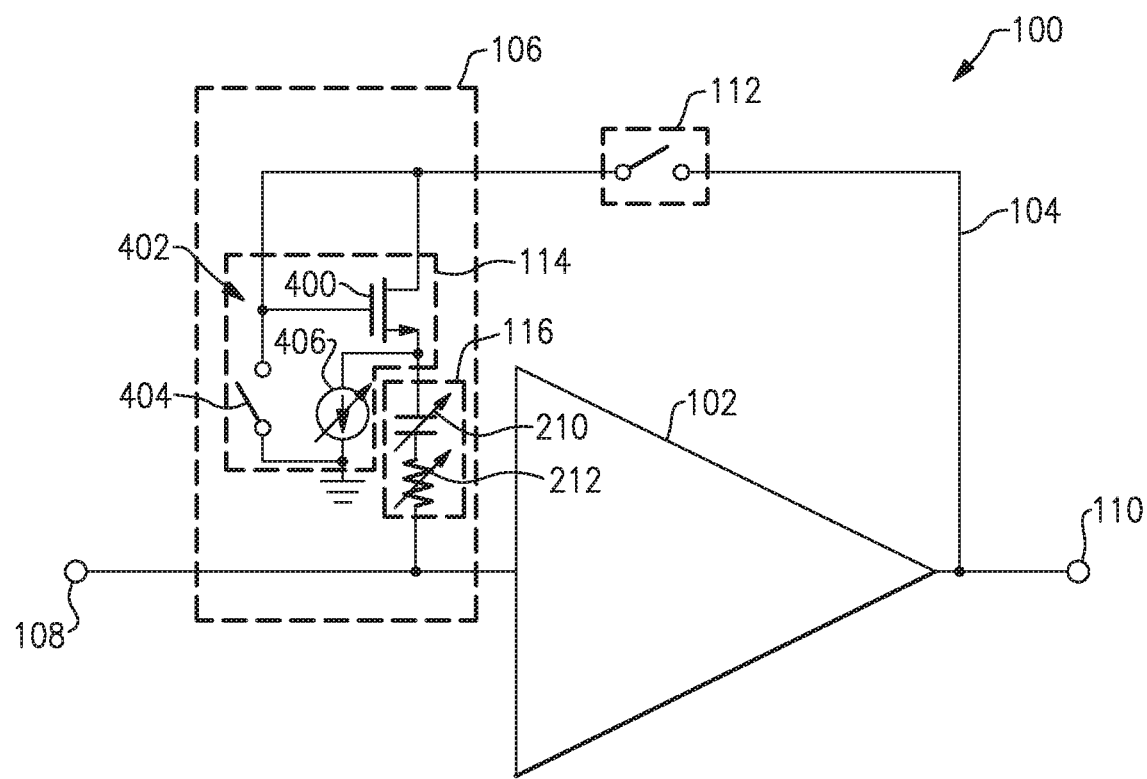
FIG. 4 is another schematic diagram of the amplifier circuit of FIG. 1, according to various examples described herein.

FIG. 4 is another schematic diagram of the amplifier circuit of FIG. 1, according to various examples described herein. Similar to FIG. 2 and FIG. 3, FIG. 4 illustrates an example implementation of the non-linear current generator 114 and the phase-shifting circuit 116. As illustrated, the non-linear current generator 114 may include a transistor 400 and biasing circuit 402. While the transistor 400 is illustrated as a three-terminal metal-oxide-semiconductor field-effect transistor (MOSFET) having a source, a drain, and a gate, in various other examples, the transistor 400 may be a different type of transistor or may be a MOSFET having more than three terminals. In the illustration of FIG. 4, the drain is selectively coupled to the signal output 110 via the bypass switch 112, and the source is coupled to the phase-shifting circuit 116.

The biasing circuit 114 may include various circuit elements configured to control a bias of the transistor 400, and therefore, the mode of operation of the amplifier linearity boost circuit 106. As previously discussed with reference to at least FIG. 2 and FIG. 3, the amplifier linearity boost circuit 106 may operate in one of a bypass mode of operation and a feedback mode of operation. During the bypass mode, the bypass switch 112 is open, and during the feedback mode the bypass switch 112 is closed. However, as discussed above, in some examples the bypass switch 112 is optional, and may be removed from the feedback path 104. In these examples, one or more components of the non-linear current generator 114 may be controlled to decouple or couple the amplifier linearity boost circuit 106 from the signal output 110. For instance, in examples in which the bypass switch 112 has been removed, the transistor 400 acts as a switch during the bypass mode to decouple the amplifier linearity boost circuit 106 from the signal output.

In FIG. 4, the biasing circuit 402 is illustrated as including a bias switch 404 and a current source 406. The drain of the transistor 400 is selectively coupled to the signal output 110 via the bypass switch 112, and also coupled to the gate of the transistor 400. The bias switch 404 is positioned to selectively short the gate to an electrical ground. The current source 406 is coupled between the source and the electrical ground. In FIG. 4, the current source 406 is shown as a variable current source. For instance, the current source 406 may include a current mirror. However, in other examples other types of current sources may be used.

During the feedback mode of operation, the bias switch 404 is opened to decouple the gate from the electrical ground. Accordingly, during the feedback mode of operation, the current source 406 sinks the current from the source of the transistor 400, and the transistor 400 is biased to an ON state. During the feedback mode, conductance occurs between the source and drain to provide a non-linear current to the phase-shifting circuit 116 based on the amplified signal. During the bypass mode of operation, the bias switch 404 is closed to short the gate to the electrical ground. Accordingly, during the bypass mode of operation, the transistor 400 is biased to an OFF state, and no conductance occurs between the source and the drain. In various examples, the properties of the current source 406 may be selected (e.g., dynamically) to control an operating point of the transistor 400. For instance, the current source 406 may include at least two transistors (e.g., NFET transistors). The first of the two transistors may operate as a diode, and the second of the two transistors may operate as a current source (e.g., current mirror). The second transistor is coupled to the source of the transistor 400. By controlling the current through the first transistor (i.e., diode transistor), the second transistor (i.e., current mirror) is operable to adjust the current through the transistor 400. While the bias switch 404 is illustrated as a single-pole single-throw switch, in certain other examples, the bias switch 404 may be implemented as any other suitable switch.

In various examples, the implementation of the phase-shifting circuit 116 illustrated in FIG. 4 may include many of the same components as the implementation of the phase-shifting circuit 116 illustrated in FIG. 2. For instance, the phase-shifting circuit 116 may include the capacitor 210 coupled in series with the resistor 212 between the non-linear current generator 114 and the signal input 108. Accordingly, the capacitor 210, the resistor 212, and more generally, the phase-shifting circuit 116, as shown in FIG. 4 may operate in a manner similar to that previously described with reference to FIG. 2. It should be appreciated that while each of the biasing circuits 114 of FIGS. 2-4 included a three-terminal transistor 200, 300, 400, each of the transistors could alternatively be replaced with a diode (not shown) connected between the bypass switch 112 and the phase shifting circuit 116.

Figure 5:
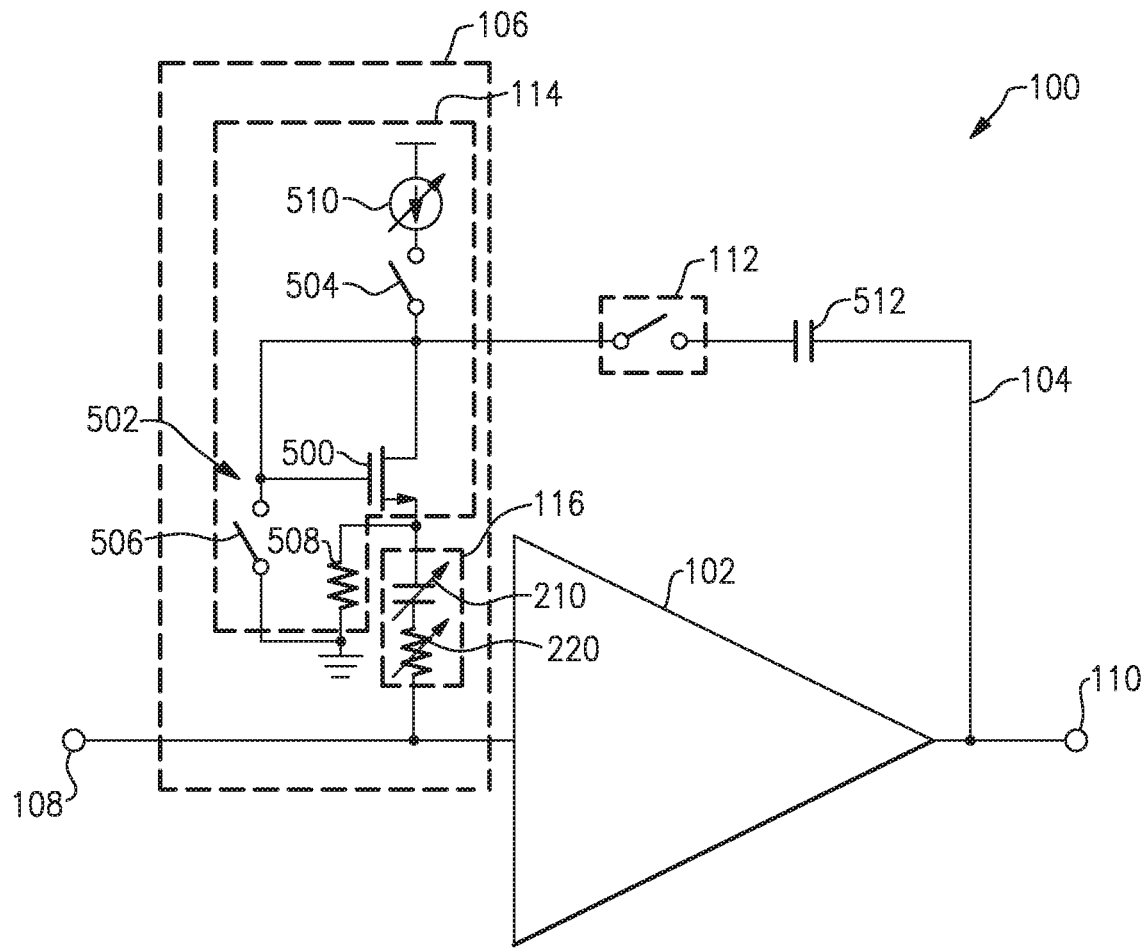
FIG. 5 is another schematic diagram of the amplifier circuit of FIG. 1, according to various examples described herein.

FIG. 5 is another schematic diagram of the amplifier circuit 100 of FIG. 1, according to various examples described herein. Similar to FIGS. 2-4, FIG. 5 illustrates an example implementation of the non-linear current generator 114 and the phase-shifting circuit 116. As illustrated, the non-linear current generator 114 may include a transistor 500 and a biasing circuit 502. While the transistor 500 is illustrated as a three-terminal metal-oxide-semiconductor field-effect transistor (MOSFET) having a source, a drain, and a gate, in various other examples, the transistor 500 may be a different type of transistor or may be a MOSFET having more than three terminals. In the illustration of FIG. 5, the drain is selectively coupled to the signal output 110 via the bypass switch 112, and the source is coupled to the phase-shifting circuit 116.

The biasing circuit 502 may include various circuit elements configured to control a bias of the transistor 500, and therefore, the mode of operation of the amplifier linearity boost circuit 106. As previously discussed with reference to at least FIGS. 2-4, the amplifier linearity boost circuit 106 may operate in one of a bypass mode of operation and a feedback mode of operation. During the bypass mode, the bypass switch 112 is open, and during the feedback mode the bypass switch 112 is closed. However, in some examples, the bypass switch 112 is optional, and may be removed from the feedback path 104. In these examples, one or more components of the non-linear current generator 114 may be controlled to decouple or couple the amplifier linearity boost circuit 106 from the signal output 110. For instance, in examples in which the bypass switch 112 has been removed, the transistor 500 acts as a switch during the bypass mode to decouple the amplifier linearity boost circuit 106 from the signal output.

In FIG. 5, the biasing circuit 502 is illustrated as including a first bias switch 504, a second bias switch 506, a bias resistor 508, and a current source 510. The drain of the transistor 500 is selectively coupled to the signal output 110 via the bypass switch 112, selectively coupled via the first bias switch 504 to the current source 510, and also coupled to the gate of the transistor 500. In some examples, the amplifier linearity boost circuit 106 may include a DC blocking component positioned in the feedback path 104 between the signal output 110 and the amplifier linearity boost circuit 106. As illustrated in FIG. 5, the DC blocking component may be a DC blocking capacitor 512 interposed between the bypass switch 112 and the signal output 110. The first bias switch 504 is positioned to selectively couple the current source 510 to the drain of the transistor 500. The second bias switch 506 is positioned to selectively short the gate of the transistor 500 to an electrical ground. The bias resistor 508 is interposed between the source and the electrical ground.

During the feedback mode of operation, the first bias switch 504 is closed to couple the current source 510 to the drain of the transistor 500. Also, during the feedback mode the second bias switch 506 is opened to decouple the gate from the electrical ground. Accordingly, during the feedback mode of operation, the current source 510 supplies a current to the transistor 500, the transistor 500 is biased to an ON state, and conductance occurs between the source and drain to provide a non-linear current to the phase-shifting circuit 116 based on the amplified signal.

During the feedback mode of operation, the DC blocking component (e.g., the illustrated DC blocking capacitor 512) is positioned in the feedback path 104 to prevent current backfeed from the current source 510 to the signal output 110.

During the bypass mode of operation, the first bias switch 504 is opened to decouple the current source 510 from the drain, and the second bias switch 506 is closed to short the gate to the electrical ground. Accordingly, during the bypass mode of operation, the transistor 500 is biased to an OFF state, and no conductance occurs between the source and the drain. In various examples, a value of the resistor 508 and/or properties of the current source 510 may be selected (e.g., dynamically) to control an operating point of the transistor 500. For instance, as shown, the current source 510 may be a variable current source. In certain examples, the current source 510 may include a current mirror, as discussed with reference to FIG. 4. While the first bias switch 504 and the second bias switch 506 are each illustrated as a single-pole single-throw switch, in various other examples each of the first and second bias switches 504, 506 may instead be implemented as any other suitable switch.

In various examples, the implementation of the phase-shifting circuit 116 illustrated in FIG. 5 may include many of the same components as the implementation of the phase-shifting circuit 116 illustrated in FIG. 2. For instance, the phase-shifting circuit 116 may include the capacitor 210 coupled in series with the resistor 220 between the non-linear current generator 114 and the signal input 108. Accordingly, the capacitor 210, the resistor 220, and more generally, the phase-shifting circuit 116, as shown in FIG. 5 may operate in a manner similar to that previously described with reference to FIG. 2.

Figure 6:
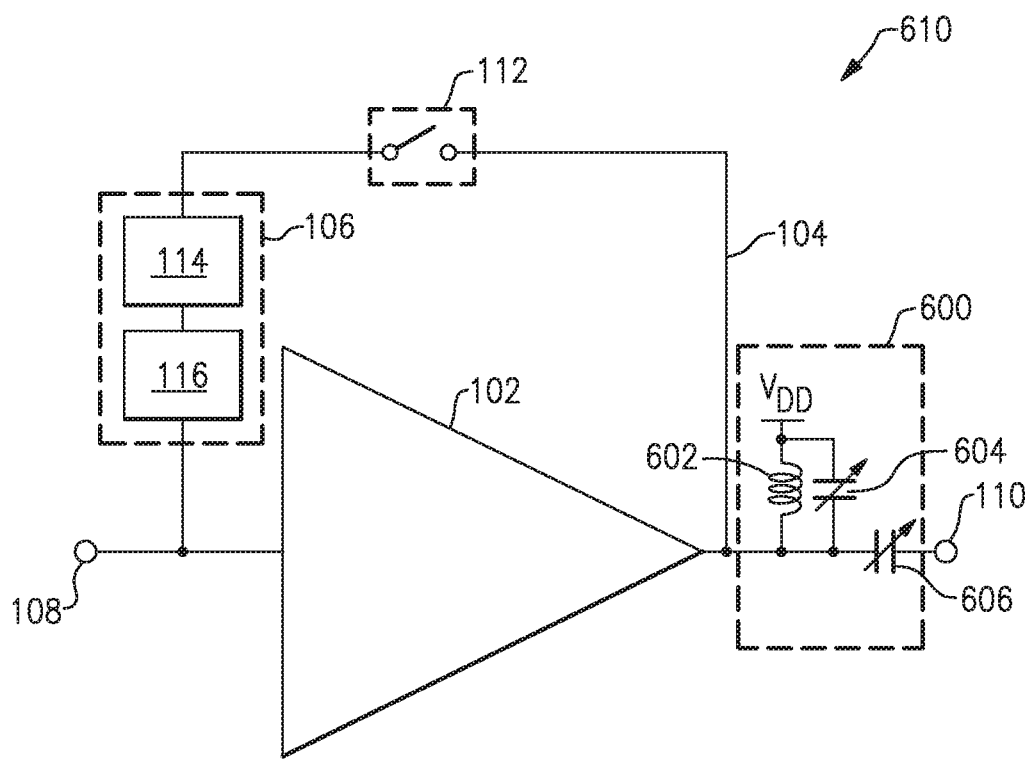
FIG. 6 is a block diagram of an amplifier circuit, according to various examples described herein.

FIG. 6 is a block diagram of an amplifier circuit 610, according to various examples described herein. FIG. 6 includes many of the same components as the amplifier circuit 100 previously described with reference to FIG. 1. For instance, the amplifier circuit 610 may include the amplifier 102, the feedback path 104, and the amplifier linearity boost circuit 106. As previously discussed, the amplifier linearity boost circuit 106 may include a non-linear current generator 114 and a phase-shifting circuit 116. Each of the non-linear current generator 114 and the phase-shifting circuit 116 are coupled along the feedback path 104 between the signal output 110 and the signal input 108.

As also shown in FIG. 6, the amplifier circuit 100 may include an impedance matching circuit 600. The impedance matching circuit 600 is positioned at the signal output 110 of the amplifier 102. While in FIG. 6 the feedback path 104 is illustrated as being coupled to the signal output 110 at a node between an output of the amplifier 102 and the impedance matching circuit 600, in certain other examples, the impedance matching circuit 600 may instead be coupled between the output of the amplifier 102 and the feedback path 104. That is, in certain examples, the feedback path 104 may receive the amplified signal from the impedance matching circuit 600. In the illustrated example, the impedance matching circuit 600 is shown as including an inductor 602, a first matching circuit capacitor 604, and a second matching circuit capacitor 606. The inductor 602 and the first matching circuit capacitor 604 are each coupled between a voltage source (e.g., shown as a VDD voltage source) and the signal output 110. The second matching circuit capacitor 606 is coupled in series between the amplifier 102 and the signal output 110. Each of the first and second matching circuit capacitors 604, 606 may be variable capacitors, as shown. In various examples, the impedance matching circuit 600 is configured to set the output impedance to a particular value, such as 50Ω. The particular impedance value may depend on the particular implementation of the amplifier circuit 100, and/or the particular amplifier 102. The impedance matching circuit 600 illustrated and described with reference to FIG. 6 may be implemented in any of the schematic diagrams of the amplifier circuit 100 previously described with reference to FIGS. 2-5.

As discussed, in various examples, the amplifier circuit 100 may include one or more switching components, such as a bypass switch and one or more bias switches. Each of the switches discussed and described with reference to FIG. 1, 2, 3, 4, 5, or 6 may be coupled to and operated by a controller. The controller may provide one or more switching signals to open or close each respective switch. In certain examples, the controller may be coupled to other components of the biasing circuits and/or components of the phase-shifting circuits described with reference to FIG. 1, 2, 3, 4, 5, or 6.

For instance, the controller may be coupled to the current source 406 illustrated in FIG. 4, the current source 510 illustrated in FIG. 5, and/or the capacitor 210 and the variable resistor 212 of the phase-shifting circuit 116. The controller may control one or more values or properties of these components via one or more control signals. That is, the controller may provide a control signal to adjust (e.g., increase or decrease) a current supplied or consumed by a current source, may provide a control signal to adjust (e.g., increase or decrease) the resistance of a resistor, and/or may provide a control signal to adjust (e.g., increase or decrease) a capacitance of a capacitor. In various examples, the controller may use a look-up table to determine and set the properties of a current source, the resistance of a resistor, and/or or the capacitance of a capacitor. The look-up table may include any array that replaces a runtime computation with an indexing operation. For instance, the look-up table may include an array of pre-calculated and indexed current source properties, resistor values, and capacitor values stored in static program storage. In certain other examples, the controller may perform one or more runtime computations to dynamically determine the properties of a current source, the resistance of a resistor, and/or or the capacitance of a capacitor necessary to achieve a desired reduction in intermodulation distortion.

The controller may also be coupled to bias inputs 310, 312 illustrated in FIG. 3, and may provide a bias voltage thereto to directly control and bias the transistor 300. A control signal value for each of the bias inputs 310, 312 (e.g., voltage values) may be retrieved from a look-up table, or dynamically determined based on one or more runtime calculations. In various examples, the controller includes a processor, which can be, for example, implemented using hardware, software, or a combination of hardware and software. The processor may provide the one or more switching signals or controls signals via a hardware or software system interface. Various examples of the processor, and more generally the controller, are further described herein with reference to at least FIG. 8.

As previously discussed, while the amplifier 102 illustrated in FIGS. 1-6 is shown as having a single input, in various other examples, the amplifier 102 may have a different type of input. In particular, the amplifier 102 may be a differential amplifier having a differential input. In these examples, the amplifier 102 may have a separate feedback path, such as the feedback path 104, positioned between each signal input and signal output pair. A respective amplifier linearity boost circuit 106 may be coupled along each respective feedback path. Each amplifier linearity boost circuit may include components similar to those previously discussed herein with reference to the amplifier linear boost circuit 106 of FIGS. 1-6, and may operate in a similar manner.

Figure 7:
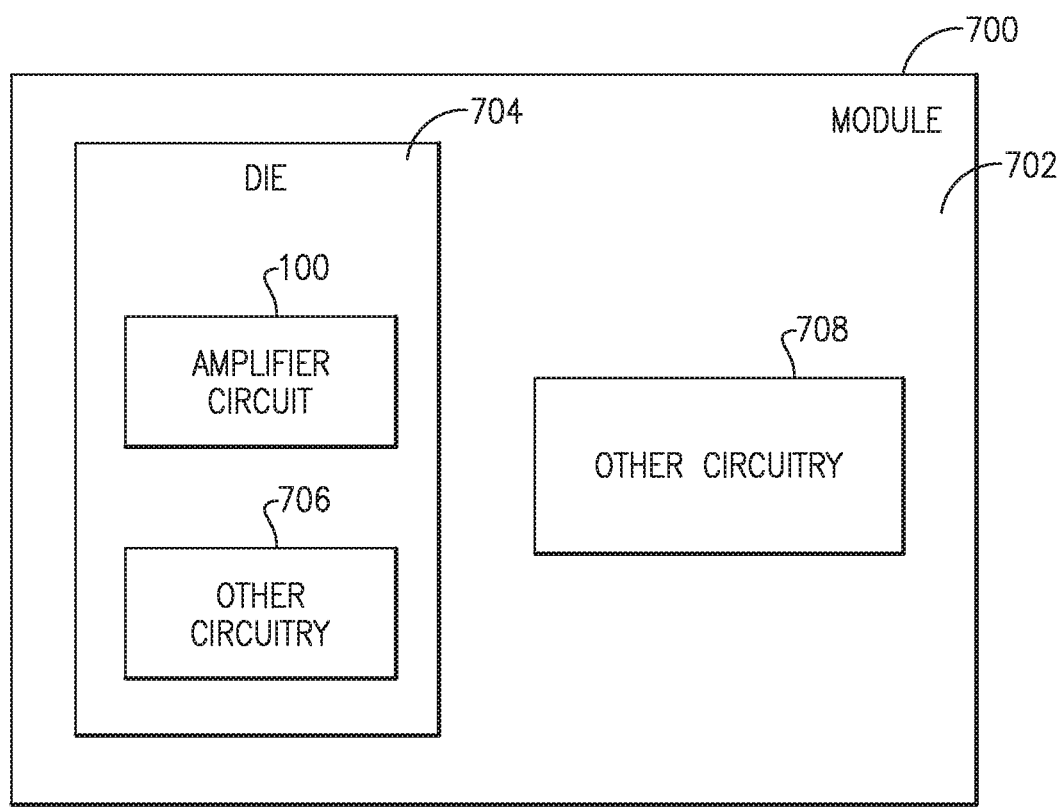
FIG. 7 is a block diagram of one example of a radio-frequency module according to examples described herein.

FIG. 7 is a block diagram of one example of a module 700 that can include an implementation of the amplifier circuit 100 illustrated in FIG. 1. The illustrated module 700 of FIG. 7 is discussed within continuing reference to the amplifier circuit 100 illustrated in FIG. 1.

In the illustrated example of FIG. 7, the module 700 includes a packaging substrate 702 that is configured to receive a plurality of components. In some examples, such components can include a die 704 having components of the amplifier circuit 100 described herein, such as the amplifier 102 and/or amplifier linearity boost circuit 106. In certain examples, other circuitry or components 706 may be coupled to the die 704. Other circuitry or components 708 can be mounted on or formed on the packaging substrate 702. In some examples, the packaging substrate 702 can include a laminate substrate.

In some examples, the module 700 can also include one or more packaging structures to, for example, provide protection and facilitate easier handling of the module 700. Such a packaging structure can include an overmold formed over the packaging substrate 702 and dimensioned to substantially encapsulate the various dies and components thereon. As discussed above, it will be understood that although the module 700 is described in the context of wirebond-based electrical connections, one or more features of the present disclosure can also be implemented in other packaging configurations, including flip-chip configurations.

Figure 8:
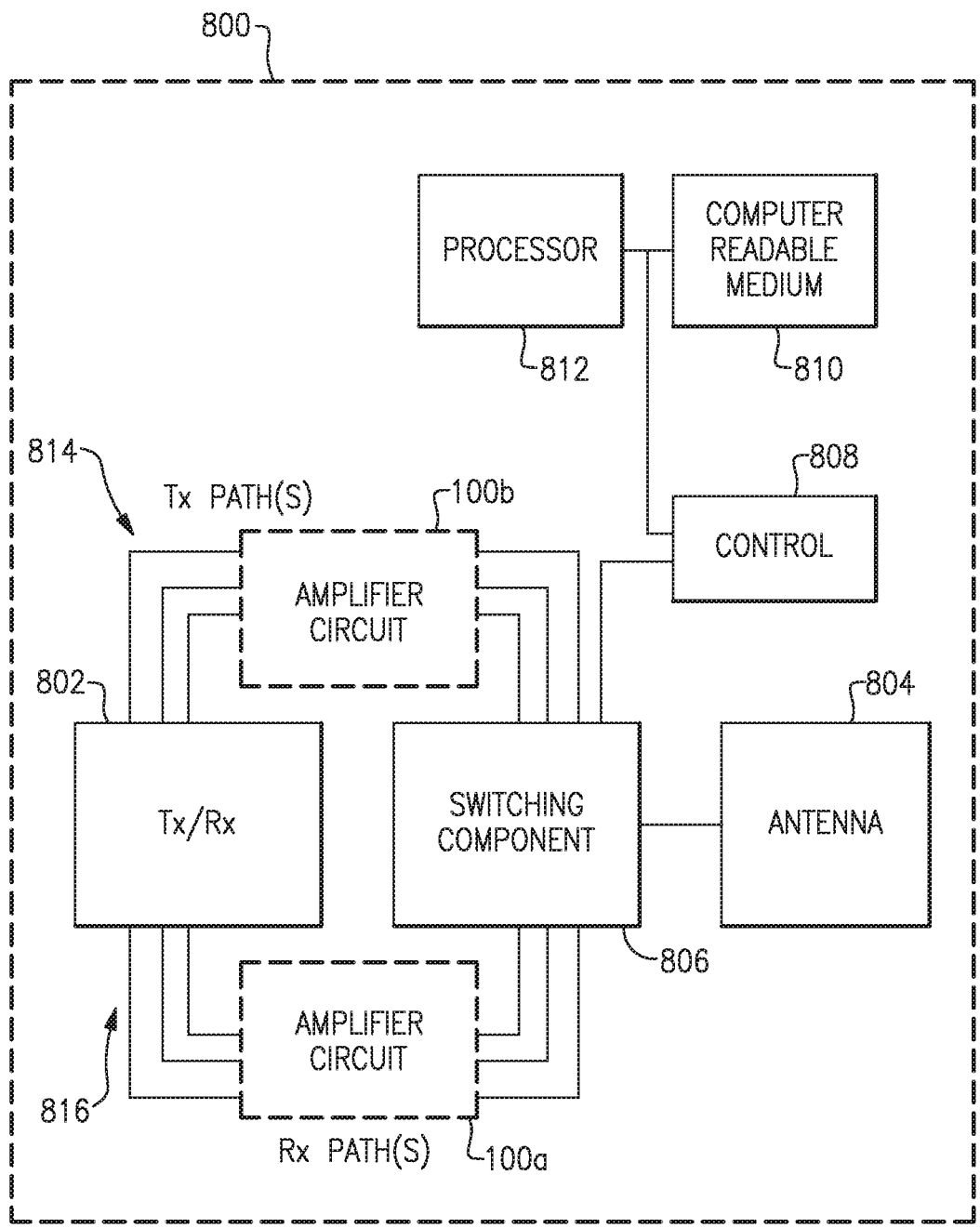
FIG. 8 is a block diagram of one example of a wireless device in which implementations of the radio-frequency module of FIG. 7 may be used, according to various examples described herein.

FIG. 8 is a block diagram of one example of a wireless communications device 800 in which the example module 700 of FIG. 7 can be used. The example wireless device 800 can be a mobile device, such as a smart phone or tablet, for example. By way of example, the wireless device 800 can communicate in accordance with Long Term Evolution (LTE). In this example, the wireless device 800 can be configured to operate at one or more frequency bands defined by an LTE standard. The wireless device 800 can alternatively or additionally be configured to communicate in accordance with one or more other communication standards, including but not limited to one or more of a Wi-Fi standard, a Bluetooth standard, a 3G standard, a 4G standard or an Advanced LTE standard.

As illustrated in FIG. 8, the wireless device 800 can include a transceiver 802, an antenna 804, a switching component 806, a control component 808 (e.g., a controller), a computer readable storage medium 810, at least one processor 812, and the amplifier circuit 100. The amplifier circuit 100 can be electrically coupled to the one or more transceivers 802 and the one or more components of the switching component 806 and can act as a low-noise receive amplifier (shown amplifier circuit 100a), or can be electrically coupled to the one or more transceivers 802 and the one or more components of the switching component 806 and can act as a power amplifier (shown as amplifier circuit 100b). As will be appreciated by those skilled in the art, the wireless device 800 can include additional components that are not explicitly illustrated in FIG. 8 and/or a sub-combination of the illustrated components. While shown with first instance of the amplifier circuit 100a positioned within a receive path and a second instance of the amplifier circuit 100b positioned within the transmit path, in some examples, the first instance of the amplifier circuit 100a may be replaced with a traditional low-noise amplifier, or the second instance of the amplifier circuit 100b may be replaced with a traditional power amplifier.

The transceiver 802 can generate radio-frequency signals for transmission via the antenna 804. Furthermore, the transceiver 802 can receive incoming radio-frequency signals from the antenna 804. It will be understood that various functionalities associated with transmitting and receiving of RF signals can be achieved by one or more components that are collectively represented in FIG. 8 as the transceiver 802. For example, a single component can be configured to provide both transmitting and receiving functionalities. In another example, transmitting and receiving functionalities can be provided by separate components.

In FIG. 8, one or more output signals from the transceiver 802 are depicted as being provided to the antenna 804 through the second instance of the amplifier circuit 100b via one or more transmission path(s) 814. In the example illustrated, different transmission path(s) 814 can represent outputs associated with different frequency bands (e.g., a high band and a low band) and/or different power outputs. While shown as a single amplifier circuit 100b, in certain examples, each of the different transmission path(s) 814 may have a separate amplifier circuit 100.

Similarly, one or more signals from the antenna 804 are depicted as being provided to the transceiver 802 via one or more receive path(s) 816 through the first instance of the amplifier circuit 100a. While shown as a single amplifier circuit 100a, in certain other examples each of the different receive path(s) 816 may have a separate amplifier circuit 100. The switching component 806 may direct any given radio-frequency signal along the one or more transmit path 814 or the one or more receive paths 816. In the example illustrated, different receive paths 816 can represent paths associated with different signaling modes and/or different receive frequency bands. The wireless device 800 can be adapted to include any suitable number of transmission paths 814 or receive paths 816. When positioned in the transmit path(s), the second instance of the amplifier circuit 100*b* may aid in boosting a radio-frequency signal having a relatively low power to a higher power suitable for transmission. As discussed, in other arrangements, this functionality may be provided by one or more power amplifiers.

In certain examples, the antenna 804 can be connected to an antenna terminal on the switching component 806. The transceiver 802 can be connected to a radio-frequency terminal on the switching component 806 via one or more of the transmission path(s) 814 or receive path(s) 816. As discussed above, according to certain examples, the switching component 806 can route a received radio-frequency signal and facilitate switching between receive and/or transmit paths, by selectively electrically connecting the antenna 804 to a selected transmit or receive path. Thus, one or more of the transmission path(s) 814 can be active while one or more of the other transmission path(s) 814 are non-active, and similarly for the receive paths 816. The switching component 806 can provide a number of switching functionalities associated with an operation of the wireless device 800.

In certain examples, the at least one processor 812 can be configured to facilitate implementation of various processes on the wireless device 800. The at least one processor 812 can be, for example, implemented using hardware, software, or a combination of hardware and software. For instance, the at least one processor 812 may include one or more microprocessors or other types of controllers that can perform a series of instructions that manipulate data. However, in other examples the processor 812 may include specially-programmed, special-purpose hardware, such as for example, an application-specific integrated circuit (ASIC) tailored to perform a particular operations disclosed herein. In certain implementations, the wireless device 800 can include a non-transitory computer readable medium 810, such as a memory, which can store computer program instructions that may be provided to and executed by the at least one processor 812. Various ones of the components 806, 100*a*, 100*b*, 808 and the transmission and receive path(s) 814, 816 may be implemented in the same die as the amplifier circuit 100 or may be integrated within the same module as the amplifier circuit 100.

Some of the implementations described above have provided examples in connection with mobile devices. However, the principles and advantages of the examples can be used for any other systems or apparatus, such as any uplink cellular device, that could benefit from any of the circuits described herein. Any of the principles and advantages discussed herein can be implemented in an electronic system that uses transistor based switches. Thus, aspects of this disclosure can be implemented in various electronic devices. Examples of the electronic devices can include, but are not limited to, consumer electronic products, parts of the consumer electronic products, electronic test equipment, cellular communications infrastructure such as a base station, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a peripheral device, a clock, etc. Further, the electronic devices can include unfinished products.

As discussed herein, various examples of the described amplifier circuits include an amplifier linearity boost circuit coupled along a feedback path between a signal input and a signal output of an amplifier. Based on an amplified signal at the signal output of the amplifier, the amplifier linearity boost circuit is configured to apply a non-linear current to the signal input of the amplifier to reduce an intermodulation distortion of the amplified signal. FIG. 9A is a graph 900 of a Monte Carlo simulation response of a typical amplifier circuit, and is representative of the intermodulation distortion experienced by a typical amplifier. For instance, FIG. 9A illustrates a Monte Carlo simulation response for an amplifier that has a moderate gain of about 15 dB, with a supply current of 4 mA. In the graph 900 of FIG. 9A, the vertical axis is representative of the number of samples, and the horizontal axis is representative of the sampled (or measured) third-order intercept point (IIP3) values of the typical amplifier circuit. The plotted bars within the graph 900 represent the third-order intercept point (IIP3), and the plotted line represents a nominal value.

Figure 9B:
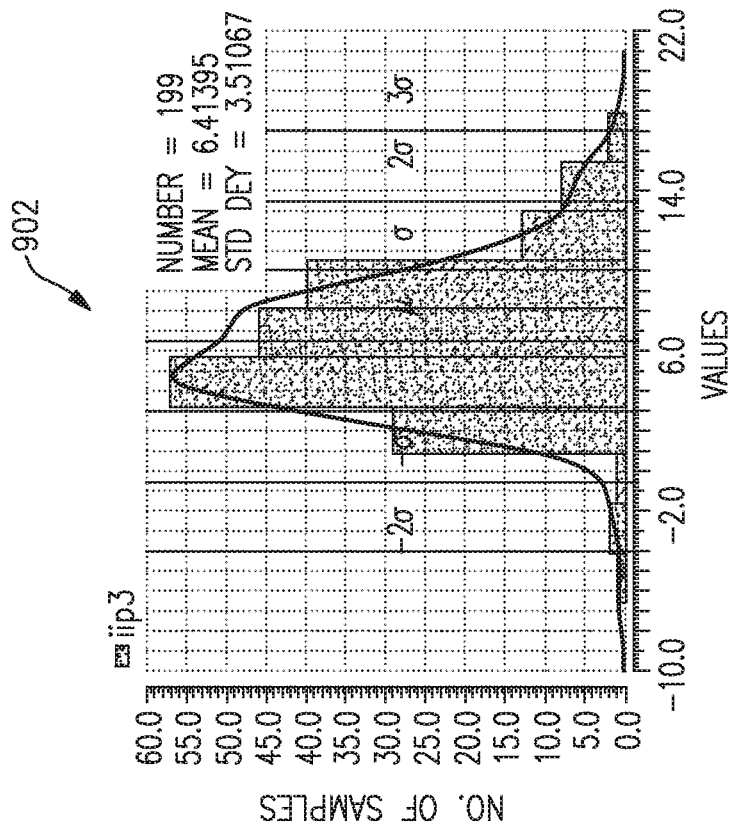
FIG. 9B is a graph of a Monte Carlo simulation response of the amplifier circuit of FIG. 1 that is illustrative of the reduced intermodulation distortion, according to various examples described herein.
Figure 9A:
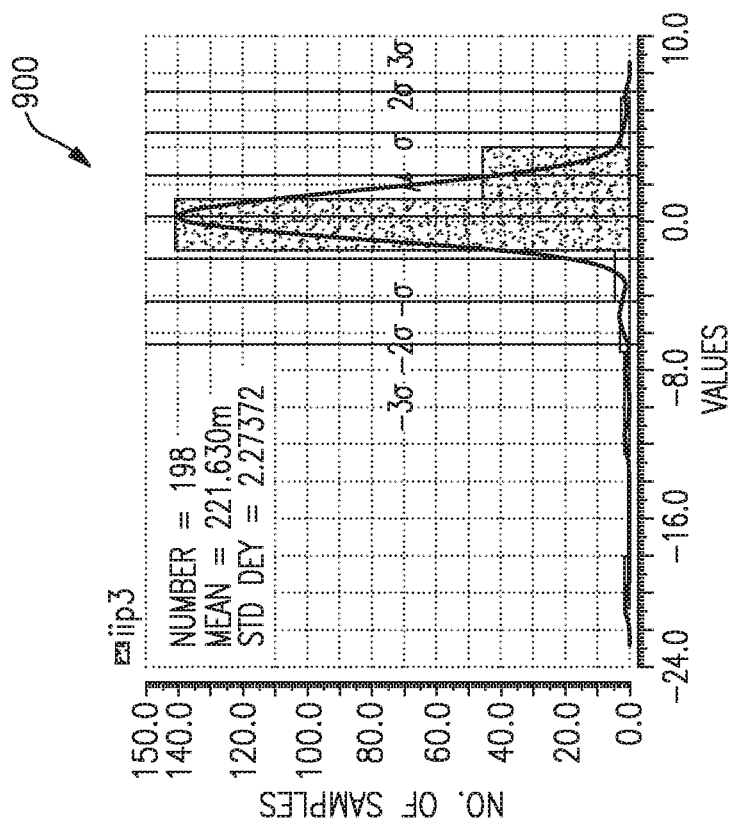
FIG. 9A is a graph of a Monte Carlo simulation response of an amplifier circuit that is illustrative of the intermodulation distortion of a typical amplifier circuit.

FIG. 9B is a graph 902 of a Monte Carlo simulation response of the amplifier circuit of FIG. 1, and is illustrative of a reduced intermodulation distortion relative to the intermodulation distortion represented by the graph 900 of FIG. 9A, according to various examples described herein. Similar to the graph 900 of FIG. 9A, the graph 902 of FIG. 9B has a vertical axis that represents the number of samples, and a horizontal axis that represents the sampled (or measured) third-order intercept point (IIP3) values of the amplifier circuit of FIG. 1. The plotted bars within the graph 902 represent the third-order intercept point (IIP3), and the plotted line represents a nominal value. Compared to the graph 900 of FIG. 9A, the graph 902 of FIG. 9B shows about a 6 dB average improvement over 200 samples. FIG. 9B is merely representative of one implementation of the amplifier circuit described herein. It is appreciated that in various other examples the described amplifier circuits may provide different levels of improvement.

Having described above several aspects of at least one example, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. An amplifier circuit comprising:
   an amplifier having a signal input and a signal output, the amplifier being configured to produce an amplified signal at the signal output;
   a feedback path coupled between the signal output and the signal input; and
   an amplifier linearity boost circuit positioned in the feedback path, the amplifier linearity boost circuit including a non-linear current generator including a transistor and a biasing circuit coupled to the transistor and configured to selectively bias the transistor and a phase-shifting circuit including a capacitor coupled in series with a resistor between the non-linear current generator and the signal input, the non-linear current generator being configured to provide a non-linear current based on the amplified signal, and the phase-shifting circuit being configured to adjust a phase of the non-linear current to reduce an intermodulation distortion of the amplified signal.

2. The amplifier circuit of claim 1 wherein the transistor is a metal-oxide-semiconductor field-effect transistor, the transistor having a gate, a source, and a drain, the drain being coupled to the signal output and the source being coupled to the phase-shifting circuit.

3. The amplifier circuit of claim 2 wherein the biasing circuit includes a first bias resistor coupled between the gate and an electrical ground, a second bias resistor coupled between the source and the electrical ground, and a bias switch selectively coupled in parallel with a bias capacitor between the gate and the drain.

4. The amplifier circuit of claim 3 further comprising a bypass switch positioned in the feedback path and interposed between the signal output and the non-linear current generator, the bypass switch being configured to selectively decouple the amplifier linearity boost circuit from the signal output.

5. The amplifier circuit of claim 3 wherein during a feedback mode of operation the bias switch is opened to decouple the gate from the electrical ground.

6. The amplifier circuit of claim 2 wherein the biasing circuit includes a first bias resistor coupled between the gate and a first bias input, a second bias resistor coupled between the source and a second bias input, and a bias capacitor coupled between the drain and the gate.

7. The amplifier circuit of claim 6 further comprising a bypass switch positioned in the feedback path and interposed between the signal output and the non-linear current generator, the bypass switch being configured to selectively decouple the amplifier linearity boost circuit from the signal output.

8. The amplifier circuit of claim 6 wherein during a feedback mode of operation the biasing circuit is configured to bias the transistor based at least in part on a first control signal received at the first bias input and a second control signal received at the second bias input.

9. The amplifier circuit of claim 2 wherein the biasing circuit includes a bias switch coupled between the gate and an electrical ground, and a current source coupled between the source and the electrical ground.

10. The amplifier circuit of claim 9 further comprising a bypass switch positioned in the feedback path and interposed between the signal output and the non-linear current generator, the bypass switch being configured to selectively decouple the amplifier linearity boost circuit from the signal output.

11. The amplifier circuit of claim 9 wherein during a feedback mode of operation the bias switch is opened to decouple the gate from the electrical ground.

12. The amplifier circuit of claim 2 wherein the biasing circuit includes a current source coupled to the drain via a first bias switch, a bias resistor coupled between the source and an electrical ground, and a second bias switch coupled between the gate and the electrical ground.

13. The amplifier circuit of claim 12 further comprising a direct current blocking component positioned in the feedback path and interposed between the amplifier linearity boost circuit and the signal output.

14. The amplifier circuit of claim 13 further comprising a bypass switch positioned in the feedback path and interposed between the signal output and the non-linear current generator, the bypass switch being configured to selectively decouple the amplifier linearity boost circuit from the signal output.

15. The amplifier circuit of claim 12 wherein during a feedback mode of operation the first bias switch is closed to couple the current source to the drain, and the second bias switch is opened to decouple the gate from the electrical ground.

16. The amplifier circuit of claim 1 wherein the amplifier is configured to apply a variable gain to a signal received at the signal input to produce the amplified signal at the signal output.

17. The amplifier circuit of claim 16 wherein the phase-shifting circuit is configured to shift the phase of the non-linear current based at least in part on a gain setting of the amplifier.

18. The amplifier circuit of claim 17 wherein the phase-shifting circuit includes a variable capacitor coupled in series with a variable resistor, and wherein at least one of the variable capacitor and the variable resistor are adjustable to vary the phase of the non-linear current.

19. The amplifier circuit of claim 18 further comprising a bypass switch positioned in the feedback path and interposed between the signal output and the non-linear current generator, the bypass switch being configured to selectively decouple the amplifier linearity boost circuit from the signal output based at least in part on a gain setting of the amplifier.

20. The amplifier circuit of claim 16 wherein the phase-shifting circuit is configured to adjust a magnitude of the non-linear current based at least in part on a gain setting of the amplifier.

21. The amplifier circuit of claim 20 wherein the phase-shifting circuit includes a variable capacitor coupled in series with a variable resistor, and wherein at least one of the variable capacitor and the variable resistor are adjustable to vary the magnitude of the non-linear current.

22. An amplifier feedback method comprising:
receiving a signal at a signal input of an amplifier;
amplifying the signal to provide an amplified signal at a signal output of the amplifier;
electrically coupling the signal output to the signal input responsive to a first gain setting of the amplifier to
apply a non-linear current to the signal received at the signal input based on the amplified signal and shift a phase of the non-linear current to reduce an intermodulation distortion of the amplified signal; and
electrically decoupling the signal output from the signal input responsive to a second gain setting of the amplifier.

23. The amplifier feedback method of claim 22 wherein shifting the phase of the non-linear current includes adjusting a complex impedance of a phase-shifting circuit.

24. The amplifier feedback method of claim 22 further comprising, responsive to the first gain setting, adjusting a magnitude of the non-linear current to reduce the intermodulation distortion of the amplified signal.

25. The amplifier feedback method of claim 24 wherein adjusting the magnitude of the non-linear current includes adjusting a complex impedance of a phase-shifting circuit.

26. The amplifier feedback method of claim 24 wherein adjusting the magnitude of the non-linear current includes adjusting the magnitude of the non-linear current based on the first gain setting of the amplifier.

27. The amplifier feedback method of claim 24 wherein shifting the phase of the non-linear current includes shifting the phase based on the first gain setting of the amplifier.

28. An amplifier feedback method comprising:
amplifying a signal at a signal input of an amplifier to provide an amplified signal at a signal output of the amplifier;
producing a non-linear current based on the amplified signal;
adjusting a complex impedance of a phase-shifting circuit to adjust at least one of a magnitude and a phase of the non-linear current;
electrically coupling the signal output to the signal input responsive to a first gain setting of the amplifier to apply the non-linear current to the signal at the signal input of the amplifier to reduce an intermodulation distortion of the amplified signal; and
electrically decoupling the signal output from the signal input responsive to a second gain setting of the amplifier.

* * * * *